US 6,551,881 B1
Apr. 22, 2003

(12) United States Patent
Letavic

(54) SELF-ALIGNED DUAL-OXIDE UMOSFET DEVICE AND A METHOD OF FABRICATING SAME

(75) Inventor: Tod Letavic, Putnam Valley, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/968,142

(22) Filed: Oct. 1, 2001

(51) Int. Cl.[7] .............................................. H01L 21/336
(52) U.S. Cl. ...................... 438/267; 438/270; 438/301
(58) Field of Search ................................. 438/243, 360, 438/386, 270, 267, 259, 144, 212, 387

(56) References Cited

U.S. PATENT DOCUMENTS

| 5,246,870 | A | | 9/1993 | Merchant | 437/21 |
| 5,300,448 | A | | 4/1994 | Merchant | 437/41 |
| 5,378,914 | A | * | 1/1995 | Ohzu et al. | 257/330 |
| 5,583,075 | A | * | 12/1996 | Ohzu et al. | 438/212 |
| 5,637,898 | A | | 6/1997 | Baliga | 257/330 |
| 5,864,159 | A | * | 1/1999 | Takahashi | 438/267 |
| 6,034,894 | A | * | 3/2000 | Maruyama et al. | 257/288 |
| 6,071,803 | A | * | 6/2000 | Rutten et al. | 438/149 |
| 6,163,052 | A | * | 12/2000 | Liu et al. | 438/270 |
| 6,222,769 | B1 | * | 4/2001 | Maruyama et al. | 257/288 |
| 6,306,724 | B1 | * | 10/2001 | Chen | 438/387 |
| 6,368,911 | B2 | * | 4/2002 | Fu | 438/259 |

* cited by examiner

Primary Examiner—John F. Niebling
Assistant Examiner—Walter L. Lindsay, Jr.
(74) Attorney, Agent, or Firm—Steven B. Biren

(57) ABSTRACT

A self-aligned dual-oxide UMOSFET device and a method for fabricating the same which includes a gate in the trench which self-aligns the channel body doping region and its associated body-drift region junction, the region for depositing the gate insulating layer, and the depth of ledge for the field layer step for a sidewall of a trench using a multiple-energy large angle tilt implant (LATid) technique. One of the energy levels of the LATid technique is optimized to damage a top silicon nitride layer of the LOCOS mask. The other energy levels of the LATid technique are for the formation of the channel body region in substrate mesas adjacent the trench. Implantation occurs using the same tilt angle for the implantation of the channel dopant at the multiple-energy levels.

11 Claims, 5 Drawing Sheets

SELF-ALIGNED DUAL-OXIDE UMOSFET DEVICE AND A METHOD OF FABRICATING SAME

FIELD OF THE INVENTION

This invention relates to methods for forming semiconductor devices, and more particularly to a method for forming a self-aligned dual-oxide UMOSFET device which self-aligns a channel body doping region and its associated junction, a region for depositing the gate oxide layer, and a depth of the field layer step for a sidewall of a trench with implantation of a channel dopant at multiple-energy levels.

BACKGROUND OF THE INVENTION

U.S. Pat. No. 5,637,898 describes a vertical low-voltage MOSFET construction which has a double oxide thickness along a trench sidewall and a non-uniform doping profile in the drift region. The concept of non-uniform doping profile in a drain region of a device is first described in U.S. Pat. Nos. 5,300,448 and 5,246,870, and the concept and practice of dual-oxide UMOSFET was first reported by Y. Baba et al., IEEE ISPSD symposium proceedings, p. 300,1992.

The utility of a trench UMOS device structure has been demonstrated by simulation, but attempts to fabricate the structures to achieve the performance advantage have been extremely complex, and not self-aligned.

SUMMARY OF THE INVENTION

The present invention contemplates a method for forming self-aligned dual-oxide UMOSFET which includes creating the gate by self-aligning the channel body doping region and its associated body-drift region junction, the region for depositing the gate insulating layer, and the depth of the field layer step for a sidewall of a trench with implantation of a channel dopant at multiple-energy levels.

The present invention further contemplates a self-aligned dual-oxide UMOSFET which includes a gate in the trench having a region having deposited thereon a gate insulating layer and a depth of a field layer step for a sidewall of the trench, both of which are self-aligned with the alignment and formation of the channel body doping region and the body-drift region junction through implantation of a channel dopant at multiple-energy levels.

DETAILED DESCRIPTION OF THE INVENTION

Figure 1:
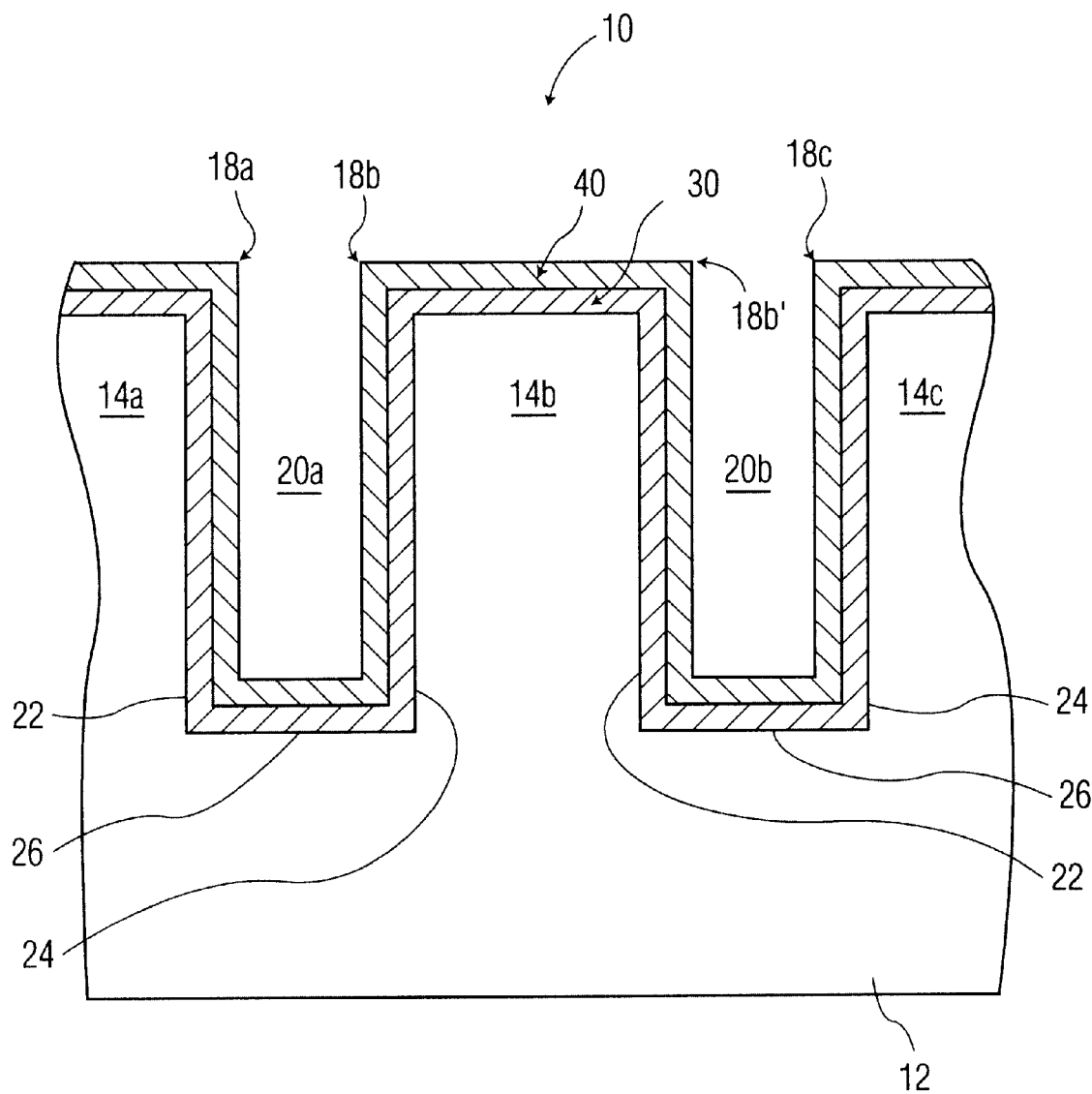
FIGS. 1 to 4 are schematic representation of structures at various stages during the fabrication of a self-aligned trench gate UMOS device in accordance with the method of the present invention.

Referring now to FIGS. 1, 2, 3 and 4, the method of the present invention will be described in detail in relation to the schematic representation of structures at various stages during the fabrication of the trench sidewall of a UMOS type device 10'''. The gate oxide layer 50 and the thick oxide layer 30 are insulating layers made of silicon dioxide, also referred to as "oxide." However, any insulating dielectric with a low dielectric constant could be used.

In general, the method of the present invention employs selective oxidation of a part of a trench sidewall 22, 24 of a UMOS device, and also incorporates self-alignment of the channel implant forming P-channel body doping regions 55a, 55b and 55b to the selective oxidation geometry for the gate 35a or 35b. In the preferred embodiment, a multiple-energy large angle tilt implant (LATid) technique is used to implant and damage a part of a dielectric mask (silicon nitride layer 40 and a thick oxide layer 30) on a trench sidewall 22, 24, as well as implant a P-channel dopant through the damaged mask to form a P-channel body doping region 55a, 55b, or 55c for the channel formation. The resultant structure is a self-aligned trench gate UMOS device 10''' in which the P-channel body doping regions 55a, 55b, 55c are self-aligned to gate oxide/field oxide field layer steps 52a, 52a' of trench 20a and gate oxide/field oxide field layer steps 52b, 52b' of trench 20b. The thin gate oxide layer 50 is field-plated by the polysilicon regions 60a and 60b in trenches 20a and 20b, respectively, to result in a small electric field at the body-drift region junctions Ja, Jb and Jc. A thicker field oxide (thick oxide layer 30) is used in the remainder of the trench to improve voltage handling specific "on" resistance figure-of-merit. A multiple-energy large angle tilt implantation (LATid) process of boron and a selective local oxidation of silicon (LOCOS) are used to form the self-aligned channel body doping region and its associated body-drift region junction, the gate oxide layer 50, the field layer steps 52a, 52a' of trench 20a and the field layer steps 52b, 52b' of trench 20b.

As shown in FIG. 1, a substrate 12, such as, without limitation, a semiconductor or silicon substrate is provided. The substrate 12 is etched to form trenches 20a and 20b, each of which is approximately 4 microns in depth and substrate mesas 14a, 14b, and 14c. Then, a thick thermal oxide (insulating) layer 30 is grown and/or deposited on the etched substrate 12 including the sidewalls 22, 24 and floor 26 of each trench 20a and 20b and substrate mesas 14a, 14b, and 14c. Thereafter, a subsequent silicon nitride layer 40 is conformally deposited onto the thick oxide layer 30 resulting in a layered trench-etched structure 10 as shown in FIG. 1. The silicon nitride layer 40 and the thick oxide layer 30 are masking layers used in a local oxidation of silicon (LOCOS) process.

In the exemplary embodiment, the thick oxide layer 30 is approximately 1200 angstroms (1200 Å).

Figure 2:
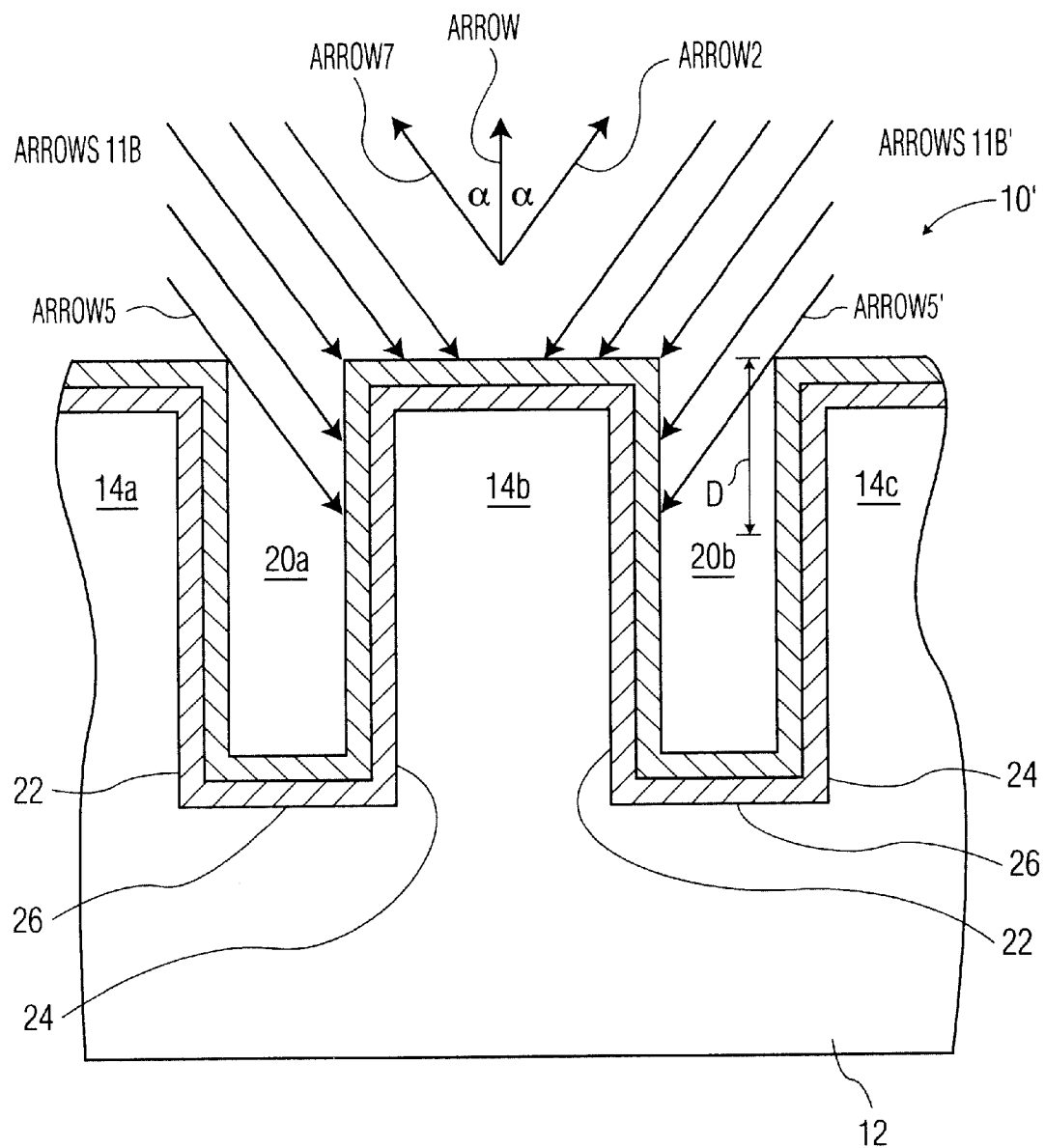

Referring also to FIG. 2, the top silicon nitride layer 40 of the layered trench-etched structure 10 is implanted with boron (B) using a multiple-energy large angle tilt implant (LATid) technique, the resultant formation hereinafter sometimes referred to as "the self-aligned structure 10'." The implantation of boron (B), represented by parallel ARROWS 11B and parallel ARROWS 11B', is implanted at an angle tiltα, represented by ARROW 1 or ARROW 2, with respect to the normal, represented by ARROW N, of the surface of substrate 12.

As will be seen from the description below, the LATid implantation of boron (B) at multiple-energy levels, simultaneously or sequentially self-aligns the P-channel body doping region 55a, 55b or 55c and its respective body-drift region junction Ja, Jb, or Jc with the region 45a, 45b or 45c for depositing the gate oxide layer and the depth D of the field layer step 52a, 52a', 52b, or 52b' for a sidewall 22 or 24 of a trench 20a or 20b.

The LATid implantation of boron (B) damages those regions of the silicon nitride layer 40 which are implanted with boron and thereby self-aligning the regions 45a, 45b and 45c for depositing the gate oxide layer 50 with the P-channel body doping regions 55a, 55b, and 55c, respectively. In other words, the LATid implantation of boron effectuates weakening of the silicon nitride layer 40 and makes the etch rate of the damaged regions increase in a wet chemical etchant. The use of the wet chemical etchant is described in detail below in relation to FIG. 3. The LATid implantation of boron occurs over the top surfaces of substrate mesas 14a, 14b and 14c. Furthermore, the angle tiltα allows boron to be implanted a predetermined depth D in trenches 20a and 20b along the sidewalls 22 and 24. As shown, ARROW 5, of ARROWS 11B, is essentially tangential to corner 18a (FIG. 1), defined by the junction of trench sidewall 22 of trench 20a and mesa 14a, and intersects with the silicon nitride layer 40 along sidewall 24 of trench 20a at approximately a depth D in trench 20a and penetrates therethrough. Likewise, ARROW 5', of ARROWS 11B', is essentially tangential to corner 18c (FIG. 1), defined by the junction of trench sidewall 24 of trench 20b and mesa 14c, and intersects with the silicon nitride layer 40 along sidewall 22 of trench 20b at approximately the depth D in trench 20b and penetrates therethrough.

The LATiD implant of boron (B), represented as parallel ARROWS 11B and parallel ARROWS 11B', is implanted through sidewall 24 of trench 20a, sidewall 22 of trench 20b and corners 18b and 18b' of substrate mesa 14b and the top of substrate mesa 14b. However, the LATiD implant of boron (B) also occurs along sidewall 22 of trench 20a, sidewall 24 of trench 20b and corners 18a and 18c of substrate mesas 14a and 14c, respectively, and the surfaces of substrate mesas 14a and 14c.

In the preferred embodiment, implantation on the sidewalls 22 and 24 of trenches 20a and 20b occurs simultaneously by spinning or rotating the wafer continuously with respect to the surface normal to get complete 360E implantation coverage in the third dimension. As the wafer rotates 180E, the implantation switches from the right side of mesa 14b to the left side of mesa 14b. Alternatively, if the wafer cannot be rotated continuously with respect to the surface normal, then quadrant or octant implant stops can be used to effectuate the implantation in 360E. Such an alternative, discretizes the implant rotation from continuous to selected angular steps.

The LATid implantation of boron is performed at multiple energy levels. One of the energy levels is optimized to damage the silicon nitride layer 40. In the exemplary embodiment, for boron implantation, an energy level in the range of 10–50 ekV is used to damage silicon nitride layer 40. The other energy levels are for the formation of a channel body doping region of a vertical transistor (MOSFET). High energy LATid implantation of boron was done through the silicon nitride layer 40 and the thermal oxide layer 30, depositing a P-channel dopant (at an energy in the range of 150–200 keV) into the substrate mesas 14a, 14b and 14c for the channel formation. The doping by LATid implantation of boron gives a continuous P-channel body doping (p-base) region 55a, 55b and 55c at the top of substrate mesas 14a, 14b and 14c, respectively. Moreover, the doping of such p-base regions 55a, 55b and 55c is highest in the center of their respective substrate mesa 14a, 14b and 14c. The LATid implantation of boron at the multiple-level may commence simultaneously so that the P-channel dopant is implanted simultaneously as the silicon nitride layer 40 is damaged. On the other hand, the energy level implantation for the implantation of the P-channel dopant and the energy level implantation for damaging the silicon nitride layer 40 can be performed sequentially. However, with the latter, the wafer does not have to be removed from the LATid implantation system between the sequential implantations. Thereby, the same tilt angle is maintained and the integrity of the self-alignment is not compromised.

Figure 3:
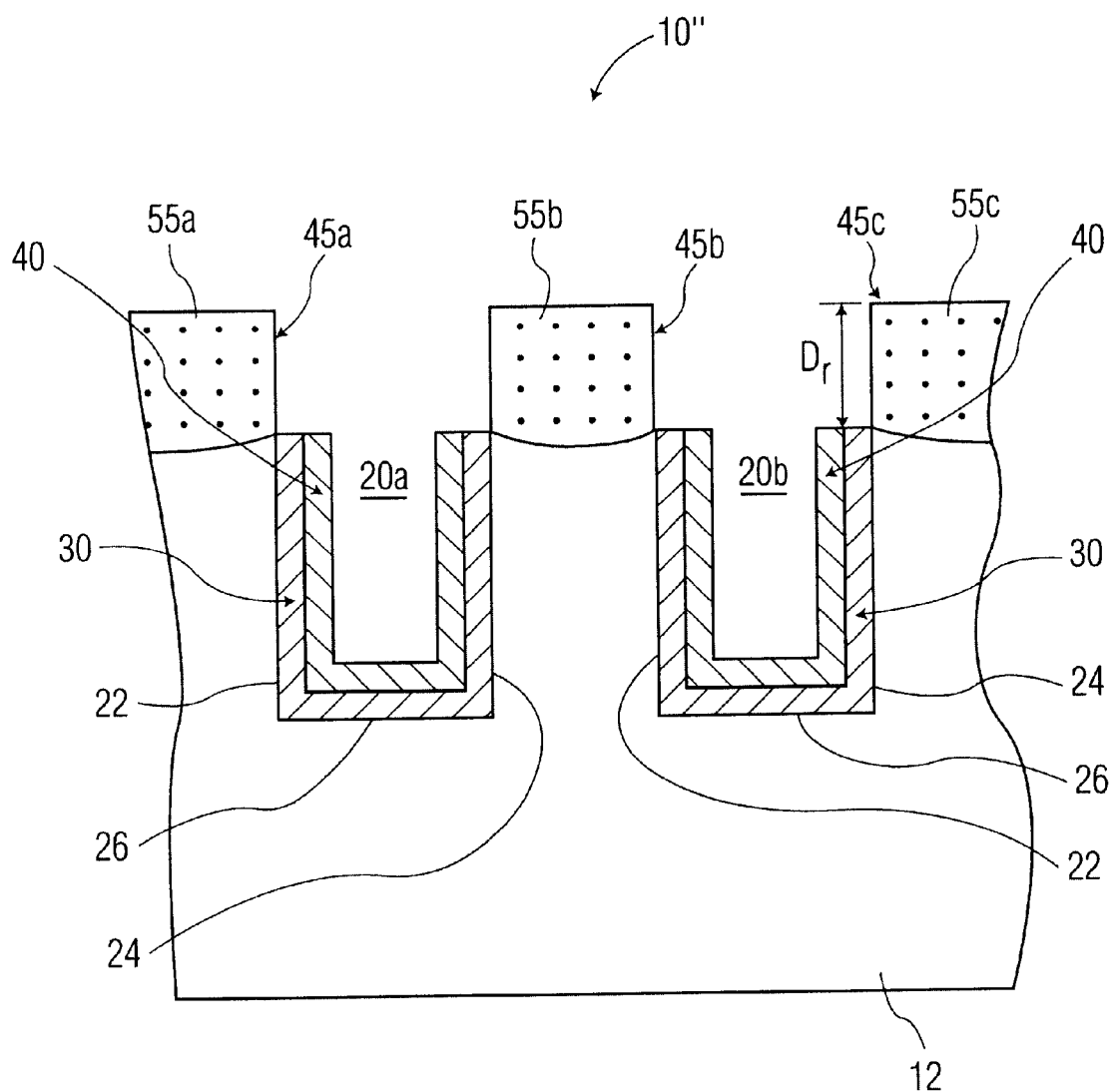

Since the high energy LATid implantation of boron used to deposit the P-channel dopant and the LATid implantation of boron used to damage the silicon nitride layer 40 of the mask are performed at the same angle tilts for both trenches 20a and 20b and substrate mesas 14a, 14b, and 14c, the P-channel body doping regions 55a, 55b or 55c and their respective body-drift region junctions Ja, Jb, Jc, the regions 45a, 45b, and 45c for depositing the gate oxide layer 50, as best seen in FIG. 3, and the depth D of the field layer steps 52a, 52a', 52b, and 52b' of trenches 20a or 20b are all self-aligned.

Although, the description herein is directed to the use of boron to implant a P-channel dopant, other species could be substituted, such as, without limitation, argon without loss of structural benefit. More importantly, the channel dopant is not limited to P-type dopants. Instead, N-type dopants may be used.

As illustrated in FIG. 3, after the multiple-energy LATid implantation of boron, wet etching is used to remove the damaged region of the silicon nitride layer 40, and that portion of the oxide layer 30 juxtaposed thereunder from the self-aligned structure 10' to expose the self-aligned regions 45a, 45b and 45c. In other words, those regions where the nitride layer 30 was not damaged during the LATid implantation of boron, little or no etching takes place. The resulting wet-etched structure 10" is shown in FIG. 3 which illustrates the resulting structure after removal of the damaged silicon nitride layer 30 and the thick oxide layer 40 (the masking layers), prior to the selective oxidation growth for the formation of the gate oxide layer 55.

The resultant wet-etched structure 10" is the result of two wet etch processes. First, after the multiple-energy LATid implantation of boron (B) (FIG. 2), the self-aligned structure 10' is wet etched in phosphoric acid $H_3PO_4$, with the damaged area of the silicon nitride layer 40 being removed, while the un-damaged area is slightly thinned. Second, after the damaged nitride layer 40 is removed, the exposed thick oxide layer 30 is wet-etched in a diluted hydrogen-fluoride (HF) solution and removed. As a result, the self-aligned regions 45a, 45b and 45c for depositing the gate oxide layer 50 are exposed. As shown, the silicon nitride layer 40 and the thick oxide layer 30 on substrate mesas 14a, 14b and 14c and along sidewalls 22 and 24 to depth D of trenches 20a and 20b were removed, giving rise to the resulting wet-etched structure 10".

Figure 4:
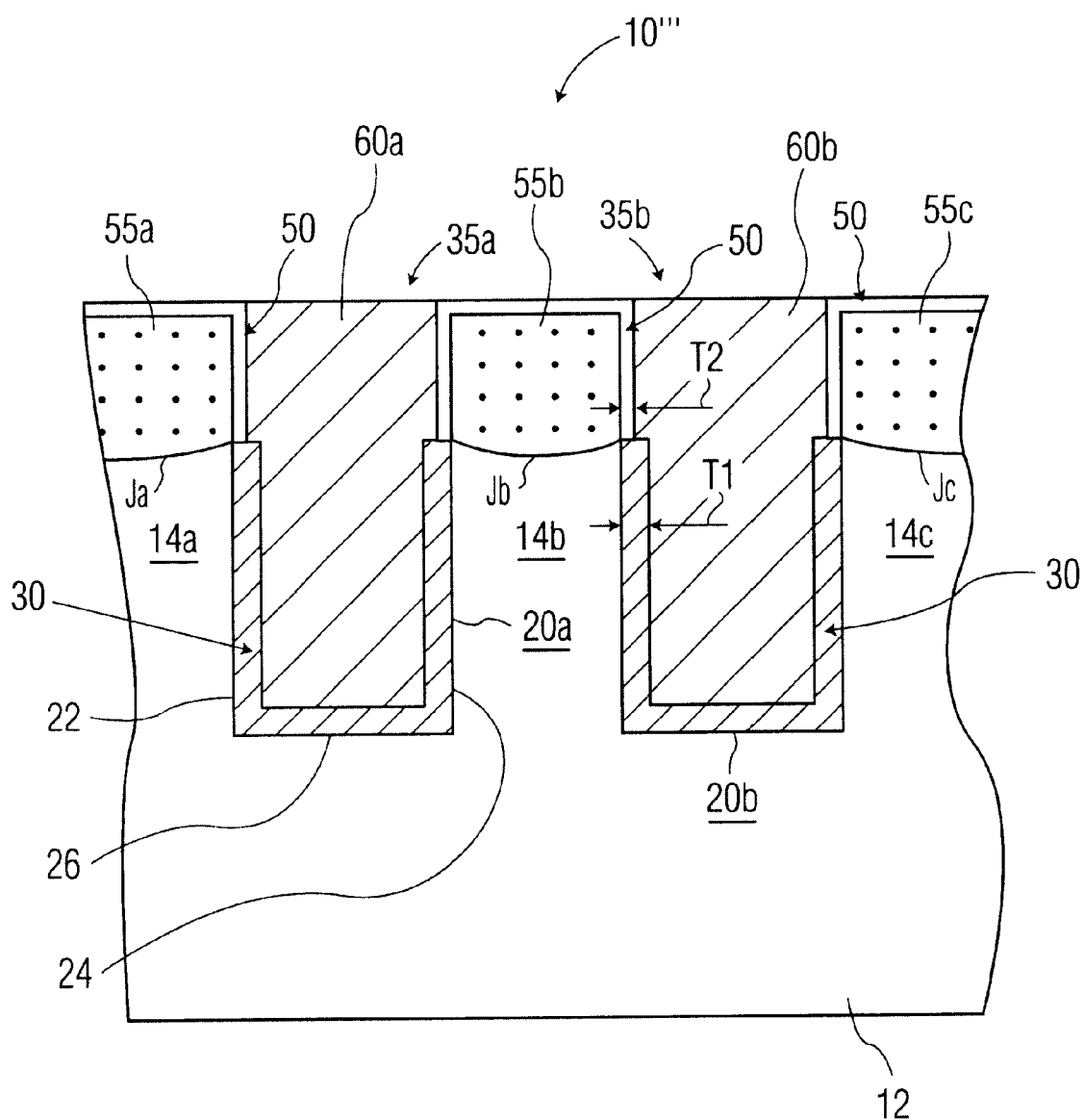

The nitride/oxide layered pattern, along the sidewalls 22 and 24 of the trench 20a and 20b, is used for a subsequent LOCOS oxidation mask to form the gate oxide layer 50, as shown in FIG. 4. As can be readily seen, the top-dotted area in each of the substrate mesas 14a, 14b and 14c is the P-channel body doping region 55a, 55b, and 55c, respectively, which is a result of the multiple-energy LATid of boron through the damaged mask (nitride/oxide layers 40 and 30) into the substrate mesas 14a, 14b and 14c and sidewalls 22 and 24 of trenches 20a and 20b. The damaged regions of the nitride layer 40 correspond substantially to surface portions of the trench sidewalls 22 and 24 and substrate mesas 14a, 14b, and 14c which are juxtaposed to the P-channel body doping regions 55a, 55b, and 55c, both of which resulted from of the multiple-energy LATid of boron. Hence, the step in the oxide/nitride mask (nitride/ oxide layers 40 and 30) with respect to the exposed portions of the sidewalls 22 and 24 juxtaposed to the P-channel body doping regions 55a, 55b, and 55c becomes the basis for the ledges of the field layer steps 52a, 52a' and 52b, 52b', as described below in FIG. 4, and is automatically self-aligned to the implanted P-channel body doping regions 55a, 55b, and 55c and their respective body-drift region junctions Ja, Jb and Jc and the regions 45a, 45b and 45c.

As shown in FIG. 4, thermal growth of a silicon dioxide gate dielectric is formed on the substrate mesas 14a, 14b and 14c and along sidewalls 22 and 24 to depth D of trenches 20a and 20b where the silicon nitride layer 40 and the thick oxide layer 30 were removed (regions 45a, 45b and 45c), during the wet etch process described above in relation to FIG. 3, to create a gate oxide layer 50. In other words, the gate oxide layer 50 is created over the surfaces juxtaposed to the P-channel body doping regions 55a, 55b, and 55c, which includes the top of substrate mesas 14a, 14b and 14c and the upper portion to the depth D of sidewalls 22 and 24 of trenches 20a and 20b.

Thereafter, the remaining regions of the silicon nitride layer 40 are removed from the trenches 20a and 20b using a wet etched process, which completes the gate layer and field layer oxide processing. The resultant oxide includes a thick oxide layer 30 having a thickness T1 which is the field oxide layer and which lines the bottom of the trench below the depth D. Furthermore, the resultant oxide includes the gate oxide layer 50 having a thickness T2 and which is juxtaposed to the surfaces of the P-channels body doping regions 55a, 55b, and 55c. Thickness T1 is greater than thickness T2. Thereby, gate oxide/field oxide field layer steps 52a, 52a' of trench 20a and gate oxide/field oxide field layer steps 52b and 52b' of trench 20b are created to be substantially aligned with the body-drift region junctions Ja, Jb, and Jc.

Then, a polysilicon gate dielectric is conformally deposited and planarized to create polysilicon regions 60a and 60b in trenches 20a and 20b, respectively, which completes the formation of the gates 35a and 35b and the self-aligned trench gate UMOS device 10'''.

In general, the growth of the silicon dioxide gate dielectric will retract the 11B and 11B' cusps in doping further towards the surface due to boron (B) consumption effectuated during oxidation. The highest P-channel dope is in the center of each of the substrate mesas 14a, 14b and 14c, resulting in avalanche breakdown in the center of each substrate mesa 14a, 14b and 14c, rather than the trench corners of trenches 20a and 20b, a desirable effect. Moreover, since the highest P-channel dope is in the center of each substrate mesa 14a, 14b, and 14c, the highest vertical electric field will occur in such center. Thus, a high voltage avalanche breakdown will be initiated in the center of the substrate mesas 14a, 14b, and 14c, rather than at the trench corners, which improves ruggedness.

Furthermore, the resultant structure of the self-aligned trench gate UMOS device 10''' can be used in a MOSFET structure where gate oxide growth and polysilicon deposition forms the gate. Along the sidewalls 22, 24 of trenches 20a and 20b, the selective oxidation gives two oxide thicknesses T1 and T2. The gate oxide thickness T2 is optimized for channel performance and the other oxide thickness T1 is optimized for voltage handling. In the exemplary embodiment, the thickness T2 depends on the maximum voltage but a good range for selecting the thickness T1 equals 600–2000 Å (thick field oxide) and T2 equals 100–600 Å (thin gate oxide). The P-channel doping is self-aligned to the field layer steps, to improve channel transconductance. The trench MOSFET is self-aligned to a gate oxide/field oxide field layer step 52a, 52a' of trench 20a or gate oxide/field oxide field layer step 52b and 52b' of trench 20b. The thin gate oxide layer 50 is field-plated by the polysilicon regions 60a and 60b in trenches 20a and 20b, respectively, to result in a small electric field at the body-drift region junction Ja, Jb, and Jc. The thicker field oxide (thick oxide layer 30) creates a field layer which lines the bottom of the trench to improve voltage handling specific "on" resistance figure-of-merit. In summary, the region 45a, 45b and 45c having deposited thereon the gate insulating layer 50 and the depth D of the field layer step 52a, 52a' and 52b, 52b' were self-aligned with the alignment and formation of the channel body doping region 55a, 55b, 55c and the body-drift region junction Ja, Jb and Jc with the implantation of the P-channel dopant at the multiple-energy levels, whether simultaneously or sequentially.

It should be noted that rectangular shaped trench geometry is predicted, but the method of the present invention is not limited to a specific trench geometry. In the third dimension, the trenches 20a and 20b could be square, circular, hexagonal, stripes, etc., as viewed from the surface of the substrate 12.

Additionally, the self-aligned trench gate UMOS device 10''' is a self-aligned dual-oxide device which can be used with uniform or non-uniform (in the vertical direction) mesa doping schemes.

Figure 5:
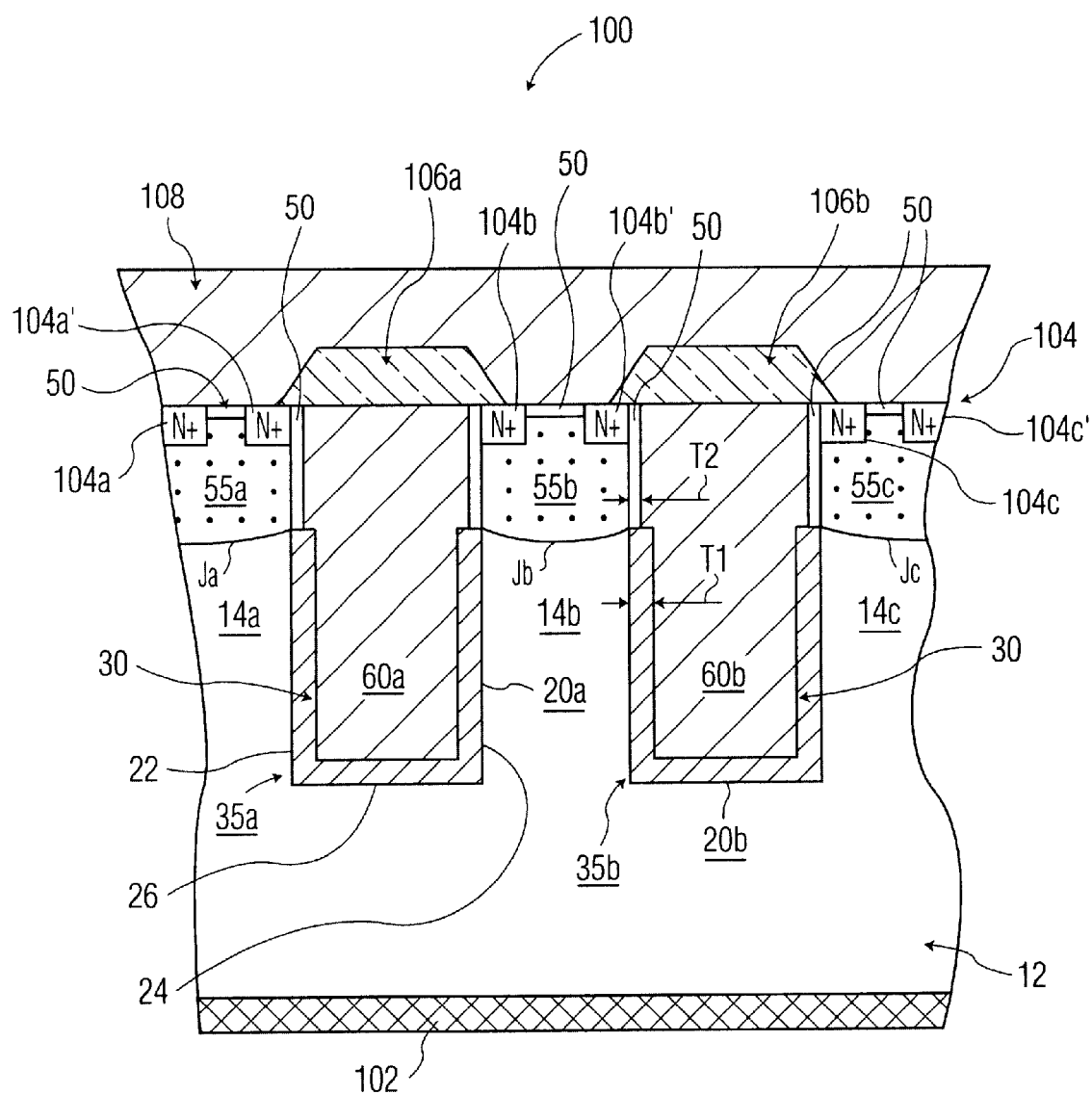
FIG. 5 illustrates a schematic representation of a self-aligned dual-oxide UMOSFET employing the self-aligned trench gate UMOS device of FIG. 4.

Referring now to FIG. 5, a schematic representation of a self-aligned dual-oxide UMOSFET 100 employing the self-aligned trench gate UMOS device 10''' of FIG. 4. The UMOSFET 100 further includes a drain 102 which is connected by metallization to the (thinned) substrate 12. The source 104 is a N-type source (75As) which includes a plurality of N+ doped islands 104a, 104a', 104b, 104b' and 104c, 104c' implanted into the surface of the P-channel body doping regions 55a, 55b, and 55c. The mask for this has a hole in it at the center of the substrate mesa 14a, 14b, 14c, so the P-channel body doping regions 55a, 55b, and 55c can be shorted to the source 104. Dielectric islands 106a and 106b are deposited and patterned with a contact mask to provide separation between the gate polysilicon region 60a, and 60b, respectively, and the source diffusion/metallization layer 108. The dielectric islands 106a and 106b are typically SiO2, each of which is 2000–5000 Å thick. Finally, the source diffusion/metallization layer 108 is >1 micron thick and is deposited over the contact dielectric islands 106a and 106b and the surface of the silicon mesa, providing source contact to the plurality of N+ doped islands 104a, 104a', 104b, 104b' and 104c, 104c' and contact to the P-channel body doping regions 55a, 55b, and 55c.

The present invention is not limited to the formation of N-channel transistors or MOSFETs, P-channel transistors or MOSFETs and other devices can be fabricated by proper selection of implant species.

Numerous modifications to and alternative embodiments of the present invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claims is reserved.

What is claimed is:

1. A method of forming a self-aligned dual-oxide UMOSFET, comprising the steps of:

etching a trench having sidewalls and a floor into a substrate;

creating a gate in the trench by self-aligning a channel body doping region having a respective body-drift region junction, a region for depositing a gate insulating layer, and a depth of a field insulating layer step on a sidewall of the trench through implantation of a channel dopant at multiple-energy levels; and forming a source and a drain;

further comprising the step of depositing in the trench and over the substrate a mask that includes an insulating layer having a first thickness, wherein the self-aligning step includes the steps of:

implanting the channel doping at a first energy level through the mask in a substrate mesa adjacent to the sidewall of the trench to create the channel body doping region with a body-drift region junction therein; and implanting the channel doping at a second energy level to damage a portion of the mask along the body-drift region junction, wherein the damaged portion of the mask defines the region for depositing the gate insulating layer and the depth of the field insulating layer step.

2. The method according to claim 1, wherein the implanting step at the first energy level and the implanting step at the second energy level occur simultaneously at a same angle.

3. The method according to claim 1, wherein the implanting step at the first energy level and the implanting step at the second energy level occur sequentially at a same angle.

4. The method according to claim 1, wherein the channel doping is highest in a center the substrate mesas.

5. The method according to claim 4, wherein the channel body region is doped with a P-channel dopant.

6. The method according to claim 1, wherein the implanting steps are performed using a multiple-energy large angle tilt implant technique.

7. The method according to claim 1, further comprising the steps of:

removing the damaged portion of the mask to expose a periphery surface of the channel body doping region defining the region for depositing the gate insulating layer while simultaneously creating the field layer step at the depth on the sidewall that is substantially self-aligned with the body-drift region junction;

forming the gate insulating layer having a second thickness over the exposed periphery surfaces of the channel body doping region from the field layer step on the sidewall wherein the second thickness is optimized for channel performance and the first thickness is optimized for voltage handling; and forming a polysilicon region in the trench which is interfaced with the gate insulating layer and the thick insulating layer.

8. The method according to claim 7, wherein the step of forming the gate insulating layer includes a local oxidation of silicon process.

9. The method according to claim 7, wherein the removing step includes wet etching in phosphoric acid the damaged portion of the mask to remove a silicon nitride layer thereby exposing the insulating layer.

10. The method according to claim 9, wherein the removing step further includes the step of wet etching in a diluted hydrogen-floride solution the exposed thick insulating layer to remove the exposed thick insulating layer.

11. The method according to claim 10, wherein:

the mask also includes a silicon nitride layer deposited over the thick insulating layer; and the removing step includes, after the forming of the gate insulating layer, removing remaining portions of the silicon nitride layer.

* * * * *